(12) United States Patent  (10) Patent No.: US 7,898,447 B2
Goshima et al.  (45) Date of Patent: Mar. 1, 2011

(54) METHODS AND SYSTEMS FOR TESTING DIGITAL-TO-ANALOG CONVERTER/AMPLIFIER CIRCUITS

(75) Inventors: Yoshikuni Goshima, Numazu (JP); Seiichi Tsuchiya, Gotemba (JP); Yoshimasa Sanmiya, Numazu (JP); John William Kay, Lagrangeville, NY (US); Chising Lai, Hopewell Junction, NY (US)

(73) Assignee: NuFlare Technology, Inc., Shizuoka-ken (JP)

( * ) Notice: Subject to any disclaimer, the term of this patent is extended or adjusted under 35 U.S.C. 154(b) by 1 day.

(21) Appl. No.: 12/504,428

(22) Filed: Jul. 16, 2009

(65) Prior Publication Data

US 2011/0012617 A1  Jan. 20, 2011

(51) Int. Cl.
*H03M 1/10*  (2006.01)
(52) U.S. Cl. .................... 341/120; 341/144; 250/396 R
(58) Field of Classification Search ................ 341/120; 250/396 R
See application file for complete search history.

(56) References Cited

U.S. PATENT DOCUMENTS

| | | | |
|---|---|---|---|
| 4,291,231 A * | 9/1981 | Kawashima et al. ..... | 250/492.3 |
| 5,276,334 A * | 1/1994 | Yamada et al. ........... | 250/492.2 |
| 5,530,250 A * | 6/1996 | Yamashita ............... | 250/396 R |
| 6,618,070 B2 * | 9/2003 | Fischer et al. ............ | 347/239 |
| 7,209,055 B1 * | 4/2007 | Stovall et al. ............ | 341/14 |
| 7,329,881 B2 * | 2/2008 | Wakimoto ............... | 250/491.1 |
| 7,462,838 B2 * | 12/2008 | Sasaki ..................... | 250/396 R |
| 7,463,173 B2 | 12/2008 | Sanmiya et al. | |
| 7,601,968 B2 * | 10/2009 | Abe et al. ............... | 250/396 R |

FOREIGN PATENT DOCUMENTS

JP 2007-271919  10/2007

\* cited by examiner

*Primary Examiner*—Khai M Nguyen
(74) *Attorney, Agent, or Firm*—Finnegan, Henderson, Farabow, Garrett & Dunner, L.L.P.

(57) ABSTRACT

A digital-to-analog converter (DAC)/amplifier testing system for use in an electron-beam (e-beam) mask writer, the e-beam mask writer including a plurality of DAC/amplifier circuits to output analog voltage signals, each DAC/amplifier circuit having a first output terminal and a second output terminal, the first output terminals of the plurality of DAC/amplifier circuits being respectively coupled to deflection plates of the e-beam mask writer to provide the output analog voltages as deflection voltages, is provided. The testing system including a summation circuit to sum voltage signals and to output a summation signal indicating the sum of the received analog voltage signals and an analyzer circuit to digitize the summation signal and to detect to compare the digitized summation signal with an error tolerance range to detect whether at least one of the DAC/amplifier circuits is experiencing an operating error.

23 Claims, 6 Drawing Sheets

METHODS AND SYSTEMS FOR TESTING DIGITAL-TO-ANALOG CONVERTER/AMPLIFIER CIRCUITS

BACKGROUND OF THE INVENTION

1. Field of the Invention

Systems and methods disclosed herein relate to the field of electronic circuits and, more specifically, to systems and methods for testing digital-to-analog converter/amplifier circuits.

2. Description of the Related Art

Integrated circuits ("ICs") are widely used as building blocks for various electronic devices and electronic apparatus. Manufacturing of ICs is typically guided by operational requirements of the various electronic devices in which the ICs will be used. For example, fabrication testing may be performed to identify operating ranges of the ICs, and the ICs are rated accordingly. Tolerance levels of ICs may also be established during fabrication testing. After determining the tolerance levels and rating the ICs in a controlled environment, the ICs may be installed in various electronic devices (referred to hereafter as "field implementation") where the ICs are expected to operate at their rated clock speeds during their entire lifetime.

To ensure that electronic devices in a field are operating at optimum levels while maintaining minimum necessary power consumption, there is a need to monitor the operation of components within the electronic devices. With reference to FIG. 1, one such component is a conventional digital-to-analog converter/amplifier circuit 100 (referred to hereafter as "DAC/amplifier circuit"). As illustrated in FIG. 1, DAC/amplifier circuit 100 may include a DAC 102 and an amplifier 104. A digital input may be provided at a terminal 106 of DAC 102. DAC 102 is configured to convert the digital input into an analog output that is provided to a terminal 108 of amplifier 104. Amplifier 104 may then amplify the analog signal and may output the amplified signal at terminal 110.

DAC/amplifier circuit 100 may be used in a variety of conventional devices, including electron-beam (e-beam) mask writing devices. Such e-beam mask writing devices are used to fabricate masks for use in semiconductor device fabrication. DAC/amplifier circuits such as circuit 100 are typically used in an e-beam mask writing device to generate analog voltages applied to beam deflection plates. To ensure that such masks are being generated accurately by the e-beam writing device, DAC/amplifier circuit 100 may be calibrated to operate with a fixed settling time and with minimal offset errors. As used herein, settling time is the interval between application of or change in a digital value to a DAC and the time at which the analog output is reached within a predetermined range. Also as used herein, offset error of a DAC is its analog output in respect to a digital input of all zeros. Thus, with regard to calibration, for example, following an application of or change in digital input at terminal 104, the settling time of DAC/amplifier circuit 100 is a time required for the amplified analog output to be reached at an amplifier output 110 within an error tolerance range of an ideal final value. When the settling time is not equal to a calibrated value, DAC/amplifier circuit 100 may be said to have a settling error.

In addition, if the amplified output at output terminal 110 is outside an error tolerance range, the DAC/amplifier circuit 100 may be said to have an offset error. An e-beam mask writer may have multiple DAC/amplifier circuits and the accuracy with which masks are generated may be greatly affected if one or more of the DAC/amplifier circuits malfunction. For example, if one or more DAC/amplifier circuits within an e-beam mask writer malfunction and the malfunctioning is not detected, the malfunctioning could result in generation of masks containing errors. Such error-containing masks would be unsuitable for use in fabrication of semiconductor devices. Detecting mask errors typically requires the use of expensive mask inspection tools and increases the overall cost of fabricating ICs.

One conventional method of monitoring the performance of DAC/amplifier circuits of an e-beam mask writer is offline testing. In accordance with such offline testing, the e-beam writer is taken offline and the DAC/amplifier circuits therein are monitored and tested by applying fixed parameters, such as fixed input voltages. Thus, offline testing delays the fabrication of masks, further contributing to the cost of manufacturing semiconductor devices.

Embodiments consistent with the present invention are directed to overcoming one or more of the above noted disadvantages of the prior art.

BRIEF SUMMARY OF THE INVENTION

Consistent with embodiments of the invention, a digital-to-analog digital-to-analog converter (DAC)/amplifier testing system for use in an electron-beam (e-beam) mask writer, the e-beam mask writer including a plurality of DAC/amplifier circuits to output analog voltage signals, each DAC/amplifier circuit having a first output terminal and a second output terminal, the first output terminals of the plurality of DAC/amplifier circuits being respectively coupled to deflection plates of the e-beam mask writer to provide the output analog voltages as deflection voltages, is provided. The testing system comprising a summation circuit, coupled to receive the output analog voltage signals on the second output terminals, to sum the received voltage signals and to output a summation signal indicating the sum of the received analog voltage signals; and an analyzer circuit comprising a high speed digitizer circuit to digitize the summation signal; and an error detection circuit coupled to receive the digitized summation signal and to compare the digitized summation signal with an error tolerance range to detect whether at least one of the DAC/amplifier circuits is experiencing an operating error.

Also consistent with embodiments of the present invention, there is provided a testing apparatus comprising a summation circuit to receive a plurality of analog voltage signals, to sum the analog voltage signals, and to output a summation signal indicating the sum of the analog voltage signals; a signal generator to generate a blanking signal; and an analyzer circuit, coupled to receive the summation signal, the analyzer circuit including a high speed digitizer to convert the summation signal into a digitized summation signal; and an error detection circuit, coupled to receive the digitized summation signal and the blanking signal, to check the digitized summation signal for an operating error by comparing the digitized summation signal with an error tolerance range, during a detection period of the blanking signal.

Further consistent with embodiments of the present invention, a testing apparatus is provided. The testing apparatus comprises a high speed digitizer to receive a summation signal and to convert the summation signal into a digitized summation signal; a controller coupled to control the high speed digitizer circuit; an error detection circuit, coupled to receive the digitized summation signal and a blanking signal, to check the digitized summation signal for an operating error by comparing the digitized summation signal with an error tolerance range, during a detection period of the blanking signal; and a memory device to store a record of the detected operating error and a corresponding time stamp, the operating error being detected when the digitized summation signal is outside the error tolerance range.

Also consistent with embodiments of the present invention, there is provided a method of testing a plurality of DAC/amplifier circuits by a DAC/amplifier testing system. The method comprising receiving a plurality of analog voltage signals respectively outputted by the plurality of DAC/amplifier circuits; summing the analog voltage signals; generating a summation signal indicating the sum of the analog voltage signals; converting the summation signal into a digitized summation signal; checking the digitized summation signal to detect an operating error; and storing a record of the operating error, in a memory device of the DAC/amplifier testing system, when the operating error is detected, wherein the record includes a sample of data representing the digitized summation signal.

Further consistent with embodiments of the present invention, a method of testing a plurality of DAC/amplifier circuits, is provided. The method being performed by an analyzer circuit and comprising receiving a summation signal indicating a sum based on output voltages of the plurality of DAC/amplifier circuits; converting the summation signal into a digitized summation signal; receiving a blanking signal; checking the digitized summation signal for an operating error by comparing the digitized summation signal with an error tolerance range, during a detection period of the blanking signal; and storing a record of the operating error, in a memory device of the analyzer circuit, when the operating error is detected, wherein the operating error is detected when the digitized summation signal is outside the error tolerance range.

The testing apparatus comprises a high speed digitizer to receive a summation signal and to convert the summation signal into a digitized summation signal; an error detection circuit, coupled to receive the digitized summation signal and a blanking signal, to check the digitized summation signal for an operating error by comparing the digitized summation signal with an error tolerance range, during a detection period of the blanking signal; and a memory device to store a record of the detected operating error, the operating error being detected when the digitized summation signal is outside the error tolerance range.

It is to be understood that both the foregoing general description and the following detailed description are exemplary and explanatory only and are not restrictive of the invention, as claimed.

BRIEF DESCRIPTION OF THE SEVERAL VIEWS OF THE DRAWING

The accompanying drawings, which are incorporated in and constitute a part of this specification, illustrate various embodiments. In the drawings.

DETAILED DESCRIPTION OF THE INVENTION

In the following description, for purposes of explanation and not limitation, specific techniques and embodiments are set forth, such as particular sequences of steps, components and configurations, in order to provide a thorough understanding of the techniques presented herein. While the techniques and embodiments will primarily be described in context with the accompanying drawings, those skilled in the art will further appreciate that the techniques and embodiments can also be practiced in other circuit types.

Reference will now be made in detail to the exemplary embodiments of the invention, examples of which are illustrated in the accompanying drawings. Wherever possible, the same reference numbers will be used throughout the drawings to refer to the same or like parts.

Figure 1:
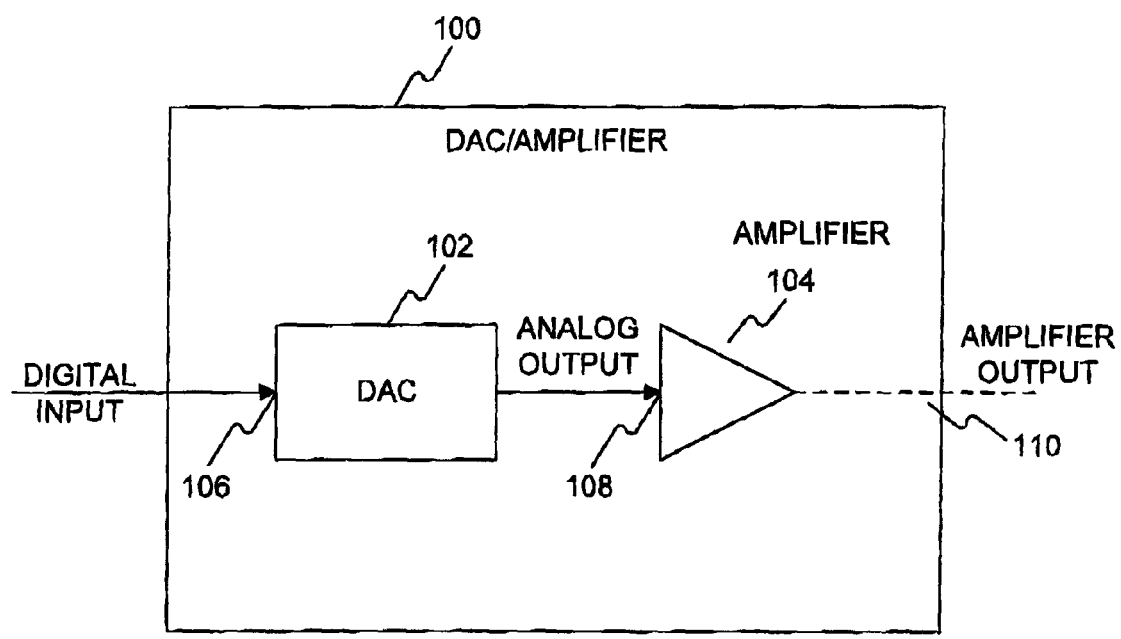
FIG. 1 is a schematic diagram of a conventional DAC/amplifier circuit.
Figure 2:
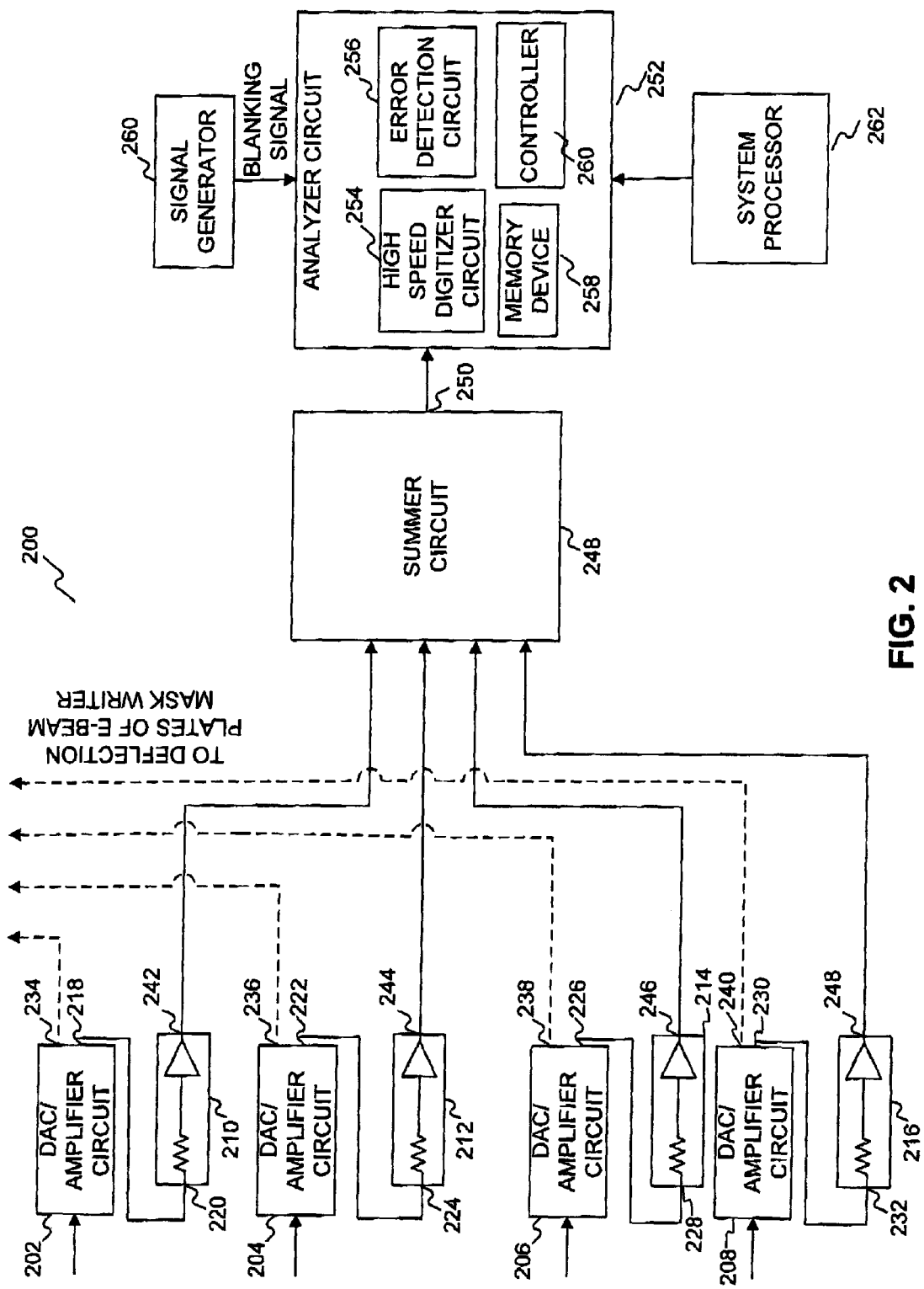
FIG. 2 is a schematic diagram illustrating a DAC/amplifier testing system, consistent with an embodiment of the invention.

FIG. 2 illustrates a DAC/amplifier testing system 200. DAC/amplifier testing system 200 may be implemented in, for example, an e-beam mask writer. For example and without limitation, testing system 200 may be implemented in an EBM-7000 e-beam mask writer offered by NuFlare Technology, Inc. of Japan. With reference to FIG. 2, a plurality of DAC/amplifier circuits 202, 204, 206, and 208 are arranged such that their output terminals are respectively coupled to monitor circuits 210, 212, 214, and 216 each configured as a high input impedance buffered amplifier. Each monitor circuit 210, 212, 214, and 216 may include a resistor coupled in series with an operational amplifier. Monitor circuits 210, 212, 214, and 216 may also be implemented within DAC/amplifier circuits 202, 204, 206, and 208, respectively.

As illustrated in FIG. 2, an output terminal 218 of DAC/amplifier circuit 202 is coupled to an input terminal 220 of monitor circuit 210, an output terminal 222 of DAC/amplifier circuit 204 is coupled to an input terminal 224 of monitor circuit 212, an output terminal 226 of DAC/amplifier circuit 206 is coupled to an input terminal 228 of monitor circuit 214, and an output terminal 230 of DAC/amplifier circuit 208 is coupled to an input terminal 232 of monitor circuit 216. In addition, DAC/amplifier circuits 202, 204, 206, and 208 may have additional output terminals 234, 236, 238, and 240, respectively. When DAC/amplifier testing system 200 is implemented in an e-beam mask writer, output terminals 234, 236, 238, and 240 are connected to deflection plates (not shown) of the e-beam mask writer.

Output terminals 218, 222, 226, 230, 234, 236, 238, and 240 are implemented to give each DAC/amplifier circuit an ability to provide substantially the same analog output voltages in parallel to the e-beam mask writer and the DAC/amplifier testing system 200. For example, DAC/amplifier circuit 218 provides an analog output voltage to monitor circuit 210, via output terminal 218, for use in testing performed by DAC/amplifier testing system 200. DAC/amplifier circuit 218 also provides substantially the same analog output voltage to a deflection plate of the e-beam mask writer, via output terminal 234, to operate as part of the e-beam mask writer.

Output terminals 242, 244, 246, and 248 of monitor circuits 210, 212, 214, and 216, respectively, are coupled to a summer circuit 248, and an output terminal 250 of summer circuit 248 is coupled to an analyzer circuit 252. Analyzer circuit 252 includes a high speed digitizer circuit 254, an error detection circuit 256, a memory device 258, and a controller 260. Controller 260 is coupled to high speed digitizer circuit 254 to control real time processing and storing of data used to test DAC/amplifier circuits 202, 204, 206, and 208. High speed digitizer circuit 254 may be implemented by using, for example, a model 5124EX digitizer offered by National Instruments of Austin, Tex. The high speed digitizer 254 and controller 260 may be based on a modular electronic instrumentation platform such as Peripheral Component Interconnect (PCI) eXtensions for Instrumentation (PXI).

A system processor 262 may be provided for interfacing with analyzer circuit 252. Such interfacing may, for example, include adjusting operating parameter of analyzer circuit 252 and receiving test data.

Error detection circuit 256 may be implemented by using a field-programmable gate array (FPGA) programmed to only store values, in memory device 258, that fall outside a predetermined acceptable error tolerance range. The predetermined acceptable error tolerance range includes predetermined limits that define the range of acceptable errors. In the present embodiment, an error threshold is a voltage error level that may cause a beam of the e-beam mask writer to deviate from an intended position, thus resulting in an error on the written mask.

Threshold values representing the predetermined acceptable error tolerance range are programmed into error detection circuit 256 prior to operation of testing system 200. In the present embodiment, the FPGA of error detection circuit 256 includes registers for storing the threshold values. A user may interface with the registers in error detection circuit 256 by using system processor 262 to change the threshold values during operation of testing system 200. Memory device 258 may be implemented by using any form of non-volatile or volatile memory, including, by way of example, semiconductor memory devices, such as EPROM, RAM, ROM, DRAM, EEPROM, and flash memory devices; magnetic disks such as internal hard disks and removable disks; magneto-optical disks; and CD-ROM disks.

DAC/amplifier testing system 200 also includes a signal generator 260 that provides a blanking signal to analyzer circuit 252. The blanking signal may be a digital signal used to control the operation of error detection circuit 256, such that error detection circuit 256 determines whether data received from high speed digitizer circuit 254 falls outside the predetermined acceptable error tolerance range during a detection period in which the blanking signal is low. In the present embodiment, signal generator 260 may generate the blanking signal based on a digital conversion of a blanking signal that is delivered to blanking plates in the e-beam mask writer. The blanking signal that is sent to the blanking plates is converted to a digitized version be compatible with testing system 200. Alternatively, signal generator 260 may generate a reference blanking signal representing a valid output of DAC/amplifier circuits 202, 204, 206, and 208 independent of the blanking signal being delivered to the blanking plates.

During operation of the e-beam mask writer, a low blanking signal represents a period during which the output voltages of DAC/amplifier circuits 202, 204, 206, and 208 are stabilized at desired values being applied to deflection plates, so that during such period the electron beam can be directed to the mask being fabricated. The period of low blanking signal represents an exposure cycle of the e-beam mask writer that is in the range of 50 nanoseconds (ns) to 200 ns. In contrast, a high blanking signal represents a period when the output voltages of DAC/amplifier circuits 202, 204, 206, and 208 are in transition and not settled, so that during such period the electron beam is directed away, or blocked, from the mask being fabricated. The period of high blanking signal represents an inactive time of approximately 50 ns.

As described in further detail below, DAC/amplifier testing system 200 is used to test DAC/amplifier circuits 202, 204, 206, and 208, while the DAC/amplifier circuits are operating at high speeds as part of, for example, the e-beam mask writer. For example, DAC/amplifier circuits 202, 204, 206, and 208 may respectively output analog output voltages on their respective output terminals 218, 222, 226, and 230 when digital input signals are provided to the DAC/amplifier circuits. The digital input signals are values representing deflection voltages and correction voltages. The digital deflection signal values represent voltages to be converted to analog values for application to deflection plates in the e-beam mask writer. The correction voltages are used to compensate for deflection of the e-beam beyond an error tolerance. Once the digital input signals are converted into analog values, analog output voltages are respectively provided to input terminals 220, 224, 228, and 232 of monitor circuits 210, 212, 214, and 216.

Monitor circuits 210, 212, 214, and 216 are used to respectively refine analog output voltages of DAC/amplifier circuits 202, 204, 206, and 208 by minimizing the effects of noise and unaccounted circuit impedance. Monitor circuits 210, 212, 214, and 216 deliver signals from the DAC/amplifier circuits 202, 203, 206, and 208 to summer circuit 248 without adversely affecting the signal being sent to the deflection plates via output terminals 234, 236, 238, and 240, respectively. Monitor circuits 210, 212, 214, and 216 ensure that precision of the signals outputted from DAC/amplifier circuits 202, 203, 206, and 208 to deflection plates is maintained by minimizing the effects of additional circuitry, in testing system 200, on the precision. These effects may include, for example, reflections of the beam or the interference caused due to the connection between DAC/amplifier circuits 202, 203, 206, and 208 and summer circuit 248.

Monitor circuits 210, 212, 214, and 216 are used to refine the analog output voltages to minimize noise and interference generated by the components in the DAC/amplifier testing system 200 with the regular operation of DAC/amplifier circuits 202, 204, 206, and 208 in, for example, the e-beam mask writer. These refined analog output voltages are provided to summer circuit 248 via output terminals 242, 244, 246, and 248 of monitor circuits 210, 212, 214, and 216, respectively.

Summer circuit 248 sums the refined voltages and provides the summation result to analyzer circuit 252. High speed digitizer circuit 254 and controller 260 operate in tandem to digitize the summation signal. In the present embodiment, high speed digitizer circuit 254 operates continuously independently of whether the blanking signal is high or low. Error detection circuit 256 receives the digitized summation signal and the blanking signal, provided by signal generator. Error detection circuit 256 identifies an error when the digitized summation signal falls outside the above noted predetermined acceptable error tolerance range due to different types of errors encountered during operation of DAC/amplifier circuits 202, 204, 206, and 208. For example, error detection circuit 256 checks the value of the digitized summation signal during sampling intervals triggered by the blanking signal being low. Under ideal operating conditions, the digitized summation signal would represent a value of zero volts (0V) due to opposite polarities of the refined voltages summed by summer circuit 248, as more fully explained below. However, error detection circuit 256 may be programmed with an error tolerance range to account for non-ideal operating conditions, that nevertheless represent acceptable operating conditions.

Due to the high operating speeds of an e-beam mask writer, e.g., the blanking signal frequency may be on the order of 10 MHz, error detection circuit 256 receives a continuous stream of data represented by the digitized summation signal. During each exposure cycle, when the blanking signal is low, error detection circuit 256 performs real time testing of samples of data represented by the digitized summation signal by comparing the samples with the stored threshold values representing the predetermined acceptable error tolerance range. For example, a sampling rate of 200 MHz may be used. DAC/amplifier testing system 200 continues to operate, as described above, if error detection circuit 256 determines that the digitized summation signal represents a value within the error tolerance range and the samples of data may be discarded by analyzer circuit 252. A user may use system processor 262 to interface with analyzer circuit 252 and change the threshold values programmed into error detection circuit 256, e.g., stored in the registers, during operation of DAC/amplifier testing system 200 and the testing operation may continue based on the new threshold values.

When error detection circuit 256 determines that the digitized summation signal represents a value outside the error tolerance range, the entire sample of data representing the waveform during the exposure cycle is stored in memory device 258 and analyzer circuit 252 provides notification that an error has been detected by, for example, generating a noise, visually displaying a message, or sending a signal to system processor 262. Controller 260 and error detection circuit 256 may also generate and attach a time stamp to the sample of data stored in memory device 258. Additional information representing data that was digitized immediately before the detection period during which the blanking signal is low may also be stored in memory 256 upon detection of an error. The stored sample of data may be retrieved from memory device 258 by system processor 262. The stored sample of data and the additional data may be used to generate waveforms to determine characteristics and types of the detected errors. For example, the waveforms may be used to determine whether the error was an offset error caused due to noise or circuit failure or a settling error. The offset error may have a different signature from the settling error and the additional information is used to perform settling evaluation of the settling error. Even after detection of an error, testing system 200 continues to operate, test, and store additional samples of data at high speed, without skipping a detection period. The stored samples of data may also be used to determine detection of false errors and further may be archived along with time stamps to analyze error trends that may be used for predictive testing.

Although DAC/amplifier testing system 200 includes four DAC/amplifier circuits and four monitor circuits, the description is for exemplary purposes and DAC/amplifier testing system 200 could be constructed to include additional or fewer components, to accommodate a particular configuration of DAC/amplifiers on an e-beam mask writer. For example, DAC/amplifier testing system 200 may be implemented with two or eight DAC/amplifier circuits and two or eight monitor circuits, respectively.

Figure 3:
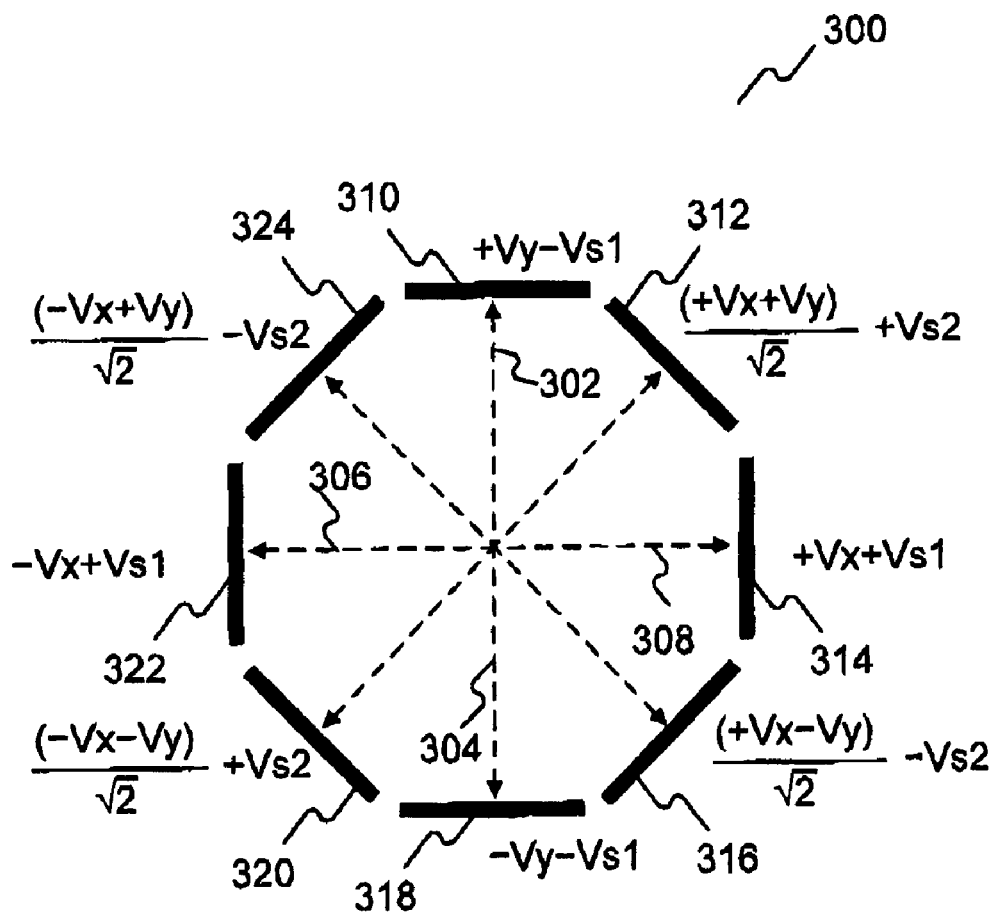
FIG. 3 is a schematic diagram illustrating summation of voltages corresponding to DAC/amplifier circuits, consistent with an embodiment of the invention.

FIG. 3 illustrates the summation of voltages corresponding to DAC/amplifier circuits of, for example, system 200. As illustrated in FIG. 3, the refined analog voltages provided on output terminals 242, 244, 246, and 248 of monitor circuits 210, 212, 214, and 216, respectively, include pairs of deflection voltages (Vx, Vy) and correction voltages (Vs1, Vs2) that may be of opposite polarities. For example, the refined voltage outputted at terminal 242 may be Vy−Vs1, the refined voltage outputted at terminal 244 may be −Vy−Vs1, the refined voltage outputted at terminal 246 may be Vx+Vs1, and the refined voltage outputted at terminal 248 may be Vx+Vs1. Arrows 302, 304, 306, and 308 in FIG. 3 correspond to the refined analog voltages outputted by monitor circuits 210, 212, 214, and 216 coupled to DAC/amplifier circuits 202, 204, 206, and 208, such that when the respective voltages are summed together, the resultant output should, ideally, be zero volts (0V) in the absence of malfunctions. Deflection plates 310, 312, 314, 316, 318, 320, 322, and 324 represent eight deflection plates included in an exemplary e-beam mask writer. As described in greater detail below, the deflection plates are symmetrically oriented and are arranged such that the voltage applied to a first deflection plate is of a polarity opposite to that applied to a second deflection plate diametrically opposed to and facing the first deflection plate, to constitute a pair of plates. The pairs of deflection plates are arranged at 45 degrees from adjacent pairs of deflection plates.

The applied voltages include two groups of deflection voltages (Vx, Vy) and astigmatic correction voltages (Vs1 and Vs2). A first group of voltages includes (+Vy−Vs1) applied to deflection plate 310 and (−Vy−Vs1) applied to deflection plate 318 that is arranged opposite to and paired with deflection plate 310. The first group of voltages also includes (+Vx+Vs1) applied to deflection plate 314 and (−Vx+Vs1) applied to deflection plate 322 that is arranged opposite to and paired with deflection plate 314. The second group of voltages includes $((+Vx+Vy)/\sqrt{2}+Vs2)$ applied to deflection plate 312, $((-Vx-Vy)/\sqrt{2}+Vs2)$ applied to deflection plate 320 that is arranged opposite to and paired with deflection plate 312, $((+Vx-Vy)/\sqrt{2}-Vs2)$ applied to deflection plate 316, and $((-Vx+Vy)/\sqrt{2}-Vs2)$ applied to deflection plate 324 that is arranged opposite to and paired with deflection plate 316. The $\sqrt{2}$ accounts for the 45 degree angle between two adjacent deflection plates.

The summation of the first group of voltages results in a signal of 0V when the four DAC/amplifier circuits 202, 204, 206, and 208 operate without error and, similarly, the summation of the second group of voltages results in a signal of 0V when four additional DAC/amplifier circuits (not shown) that generate them operate without error.

The summation of the first group of voltages by summer circuit 248 is illustrated in FIG. 2. The second group of voltages could also be applied to summer circuit 248, in which case the summation of all eight voltages of the first and second groups of voltages would result in a signal of 0V when the DAC/amplifier circuits operate without error. Alternatively, the second group of voltages could be applied to a separate second summer circuit dedicated to be used for detecting operating errors in the DAC/amplifiers associated with deflection plates 312, 316, 320, and 324. Such a dedicated second summer circuit would also have associated therewith a separate second analyzer circuit dedicated to be used with the second summer circuit.

Figure 4A:
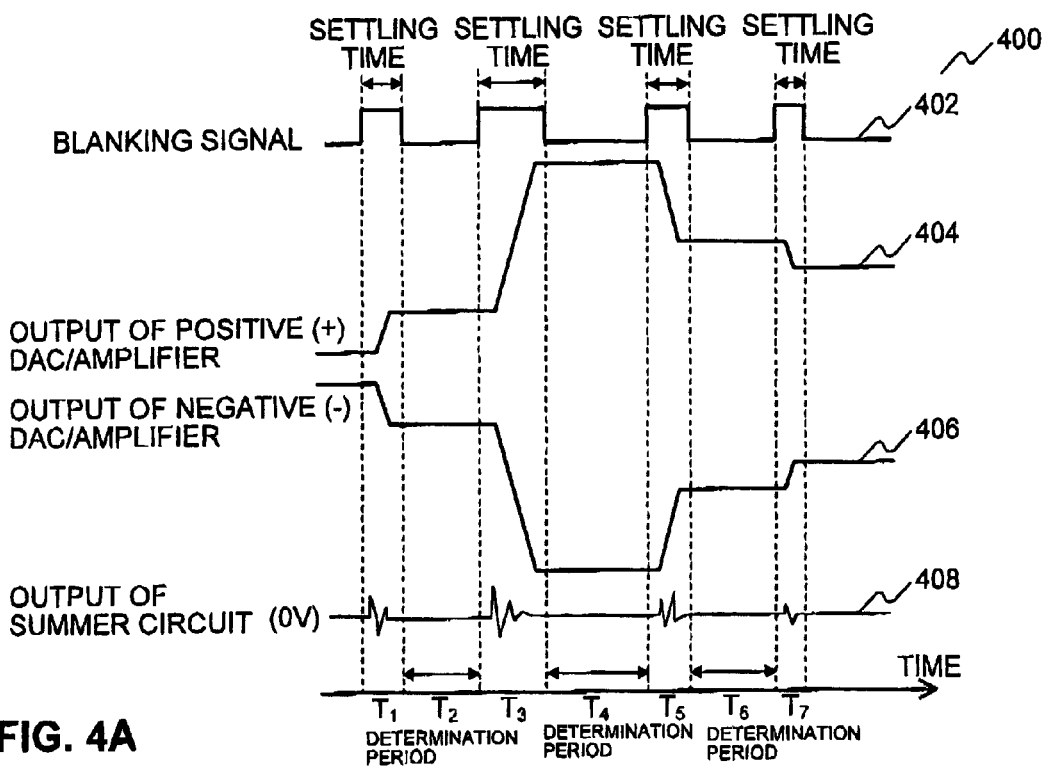
FIG. 4A is a timing diagram representing an error-free operation of DAC/amplifier circuits, consistent with an embodiment of the invention.

Referring now to FIG. 4A, a timing diagram 400 is provided representing an error-free operation of, for example, DAC/amplifier circuits 202, 204, 206, and 208 in system 200. Timing diagram 400 includes a blanking signal waveform 402, a waveform 404 illustrating a sample of data representing a positive output voltage of a DAC/amplifier circuit, a waveform 406 illustrating a sample of data representing a negative output voltage of a DAC/amplifier circuit, and a waveform 408 illustrating a sample of data representing an output of a summation circuit. For example, blanking signal waveform 402 may correspond to data representing the blanking signal generated by signal generator 260 from time $T_1$ to $T_7$, waveform 404 may correspond to data representing a positive output voltage of DAC/amplifier circuit 202, via monitor circuit 210, from time $T_1$ to $T_7$, waveform 406 may correspond to data representing a negative output voltage of DAC/amplifier circuit 204, via monitor circuit 212, from time $T_1$ to $T_7$, and waveform 408 may correspond to data representing the summation signal provided on terminal 250 from time $T_1$ to $T_7$.

Timing diagram 400 is a simplified illustration of two waveforms 404 and 406 that represent respective positive and negative output voltages of two DAC/amplifier circuits, for explanation purposes only. As noted above waveform 408 illustrates a sample of data representing the summation signal obtained by summing the output voltages represented by waveforms 404 and 406.

Waveform 402 is used as a timing signal such that times $T_1$, $T_3$, $T_5$, and $T_7$, represent settling times corresponding to DAC/amplifier circuits whose output voltages are represented by waveforms 404 and 406, e.g., DAC/amplifier circuits 202 and 204, respectively. Times $T_2$, $T_4$, and $T_6$ represent determination periods. During determination periods $T_2$, $T_4$, and $T_6$, the blanking signal is low and waveform 408 is an approximately straight horizontal line indicating that the summation of waveforms 404 and 406 is a resultant waveform of approximately 0V. As illustrated in FIG. 4A, waveform 408 indicates a value of approximately 0V during determination periods $T_2$, $T_4$, and $T_6$, thus indicating error free operation of DAC/amplifier circuits 202 and 204 that generated the analog voltages represented by waveforms 404 and 406, respectively.

Figure 4B:
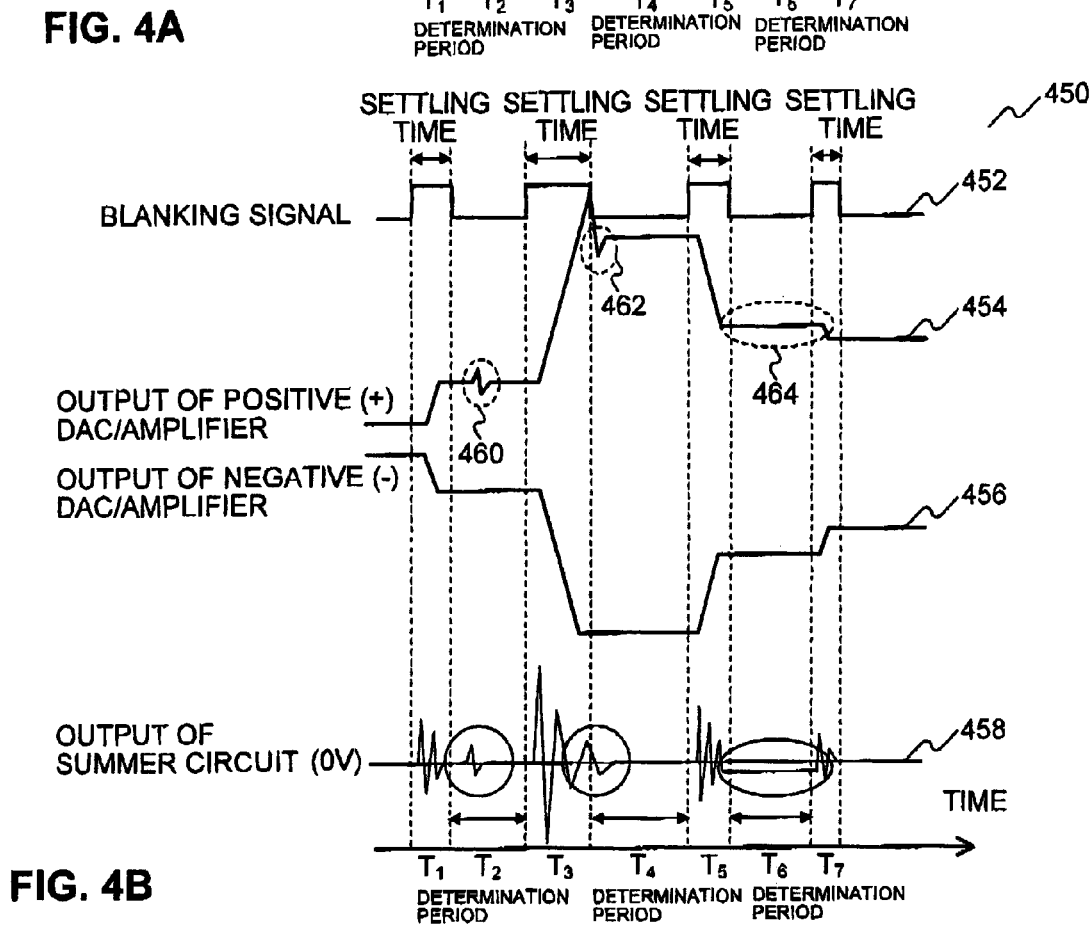
FIG. 4B is a timing diagram representing an operation of DAC/amplifier circuits having an error, consistent with an embodiment of the invention.

In contrast to FIG. 4A, FIG. 4B depicts a timing diagram 450 representing an operation of DAC/amplifier circuits such that one or more DAC/amplifier circuits are malfunctioning. Timing diagram 450 also includes a blanking signal waveform 452, a waveform 454 illustrating a sample of data representing a positive output voltage of a DAC/amplifier circuit, a waveform 456 illustrating a sample of data representing a negative output voltage of a DAC/amplifier circuit, and a waveform 458 illustrating data representing the summation signal provided on terminal 250 by summer circuit 248.

During determination periods $T_2$, $T_4$, and $T_6$, waveform 458 does not represent a signal of 0V but instead contains inconsistencies. These inconsistencies may be caused by errors in the operation of one or more of the DAC/amplifier circuits whose outputs are represented by waveforms 454 and 456. For example, waveform 458 may indicate an error during determination period $T_2$ that may be caused due to an inconsistency at point 460 on waveform 454.

A settling error may be detected by observing waveform 458 during determination period $T_4$ and the settling error may be caused due to an inconsistency at point 462 on waveform 454. An offset error may be detected by observing waveform 458 during determination period $T_6$ and the offset error may be caused due to an inconsistency at point 464 on waveform 454. Thus, errors during operation of DAC/amplifier circuits can be detected based on the values represented by the summation signal, illustrated herein as waveform 458.

Although waveforms 408 and 458 illustrate examples of error free and error detected operation of DAC/amplifiers in the illustrated embodiment the actual detection of error free or error detection operation is performed by analyzer circuit 252 in the manner described above.

Figure 5:
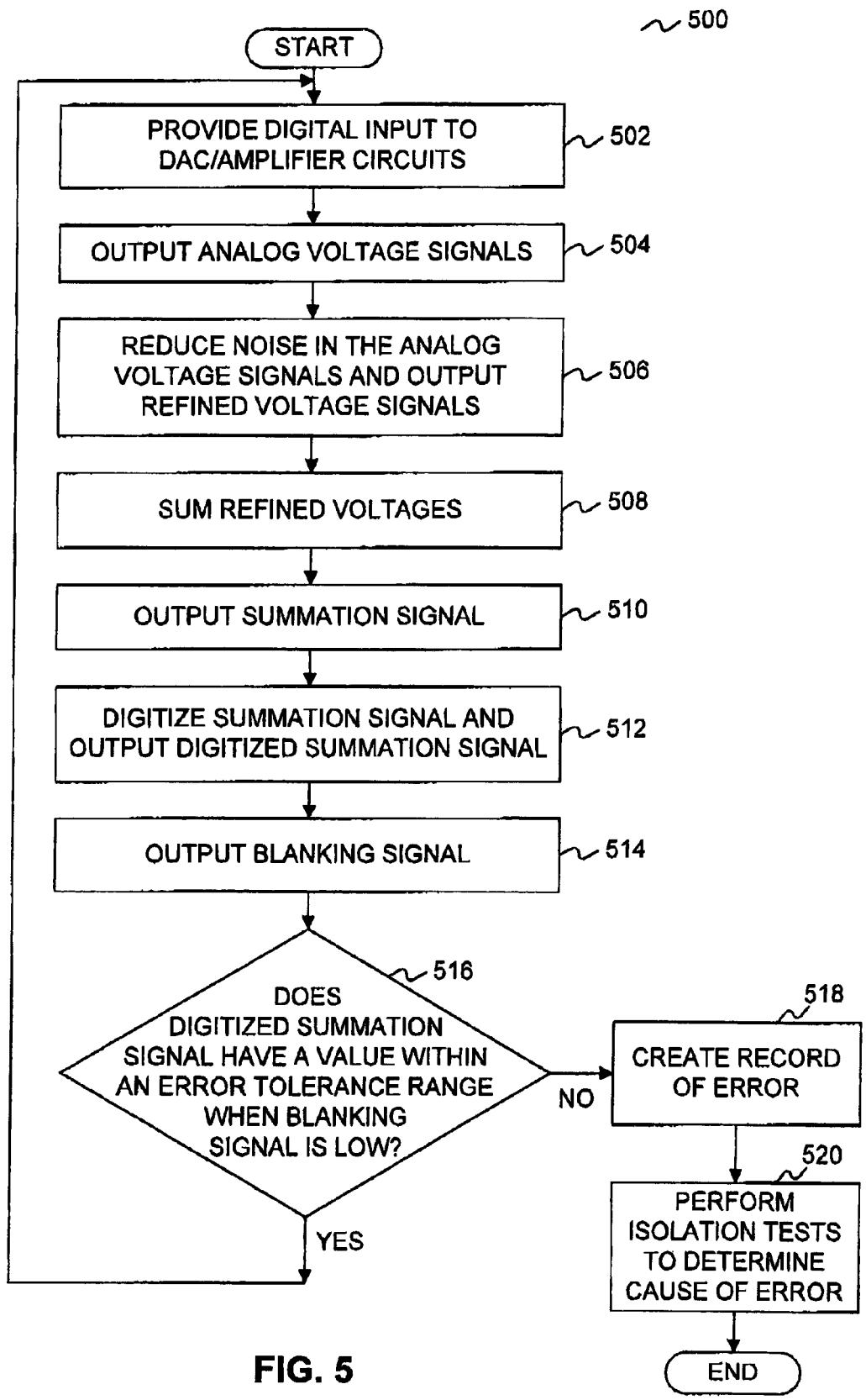
FIG. 5 shows a flow diagram of an exemplary method for testing DAC/amplifier circuits, in accordance with an embodiment of the invention.

FIG. 5 shows a flow diagram of a method 500 for testing DAC/amplifier circuits, in accordance with an embodiment of the invention. For example, method 500 may be implemented by using DAC/amplifier testing system 200. The method starts at 502 where digital input signals are provided to DAC/amplifier circuits. At 504, the DAC/amplifier circuits output analog output voltage signals. These analog output voltage signals are provided to monitor circuits. The monitor circuits may, for example, be monitor circuits 210, 212, 214, and 216 of DAC/amplifier testing system 200. Next, at 506, noise in the analog output voltage signals may be reduced and the refined output voltage signals may be outputted. The noise may be reduced by, for example, monitor circuits 210, 212, 214, and 216 and the refined output voltage signals may be outputted to, for example, summer circuit 248. Monitor circuits 210, 212, 214, and 216 minimize the effects of the connection between DAC/amplifier circuits and summer circuit 248 on the signal delivered to the deflection plates of the e-beam mask writer. An error would be caused if the noise is not reduced.

At 508, the refined voltage signals are summed. The summation may be performed by, for example, summer circuit 248. Next, at 510, a summation signal is outputted. The summation may be provided to, for example, analyzer circuit 252. The summation signal is then digitized (512) and the digitized summation signal is outputted. At 514, a blanking signal is also outputted. The blanking signal may be a digitized version of the blanking signal delivered to blanking plates or a reference blanking signal representing valid output signals of the DAC/amplifier circuits.

The summation signal may be digitized by, for example, high speed digitizer circuit 254 and the blanking signal may be generated by, for example, signal generator 260. The digitized summation signal and the blanking signal may be provided to, for example, error detection circuit 256.

At 516, the digitized summation signal is checked for errors and it is determined whether the value represented by the digitized summation signal is within an error tolerance range when the blanking signal is low. The digitized summation signal may be checked by, for example, error detection circuit 256. If the digitized summation signal represents a value within the error tolerance range, the method returns to 502 and testing continues based on the previous error tolerance range or a new error tolerance range. Alternatively, when the digitized summation signal is not within an error tolerance range, the method proceeds to 518 where a record of the error is created and a notification may be generated to indicate detection of the error. The record may be stored in, for example, memory device 258, and the notification may be generated by, for example, analyzer circuit 252. The record of the error may include data representing the entire sample of data in which the error was detected, a corresponding time stamp, and additional information representing data that was digitized immediately before the detection period during which the blanking signal is low. At 520 the recorded error data may be analyzed by generating waveforms representing the samples of stored data. Analysis of the recorded error data may include determining a type of the error, performing isolation testing to locate the component that caused the error, or archiving the data to perform predictive testing. For example, DAC/amplifiers 202, 204, 206, and 208 may be tested individually to determine the DAC/amplifier that malfunctioned, and the method ends.

Figure 6:
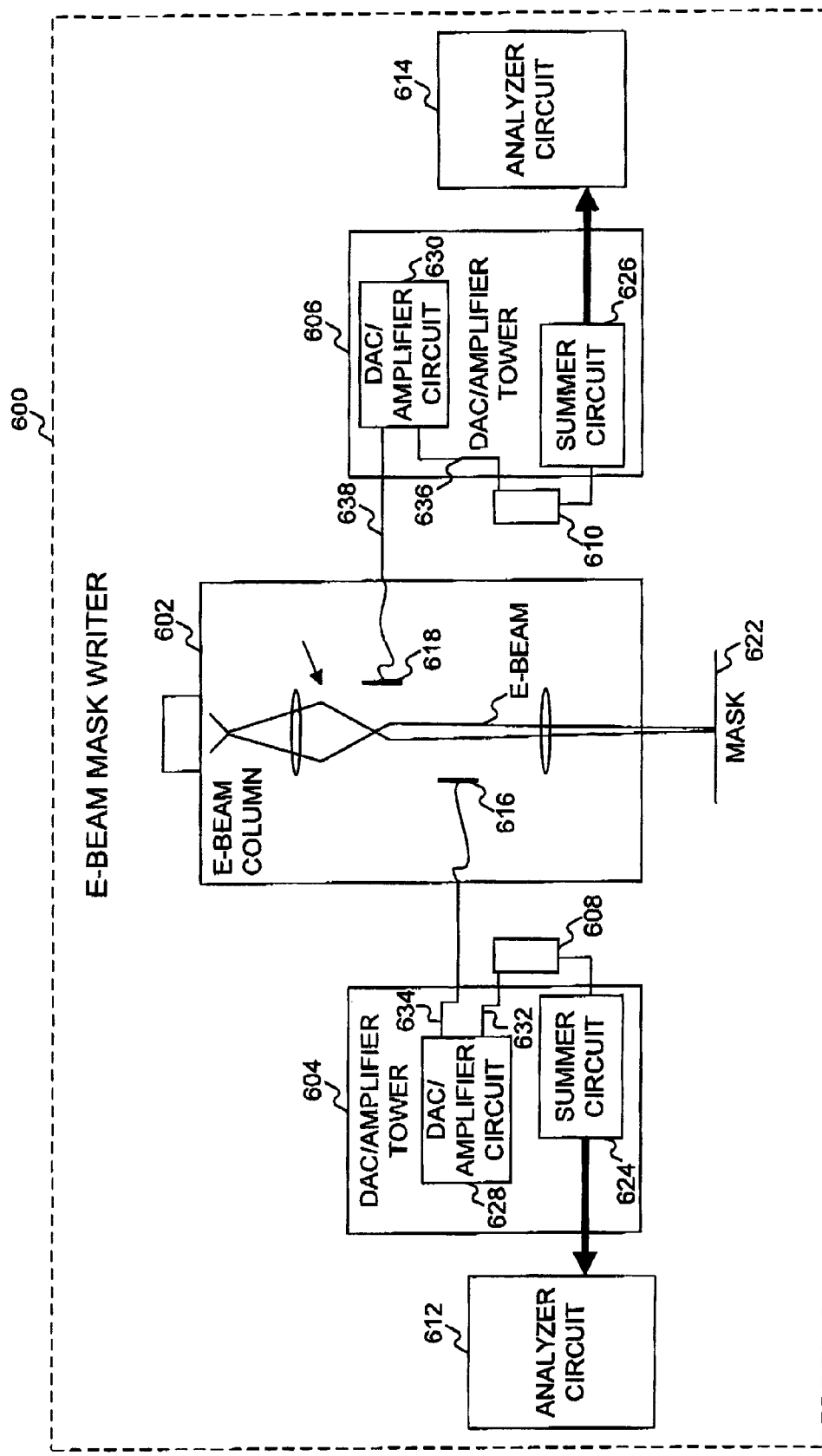
FIG. 6 is a schematic diagram illustrating an implementation of a DAC/amplifier testing system within an e-beam mask writer, consistent with an embodiment of the invention.

FIG. 6 is a schematic diagram illustrating an implementation of a DAC/amplifier testing system within an e-beam mask writer 600. E-beam mask writer 600 includes an e-beam column 602, a plurality of DAC/amplifier towers 604 and 606, a plurality of monitor circuits 608 and 610, and a plurality of analyzer circuits 612 and 614. E-beam column 602 includes deflection plates 616 and 618 that are used to control e-beam 620 that is generated within e-beam column 602. The e-beam may be used to fabricate a mask 622. Although e-beam column 602 includes two deflection plates, the description is for simplification purposes and the e-beam column 602 would, in practice, be constructed to include additional deflection plates.

DAC/amplifier towers 604 and 606 include summer circuits 624 and 626 and DAC/amplifier circuits 628 and 630, respectively. DAC/amplifier circuit 628 includes two output terminals, the first output terminal being coupled to monitor circuit 608 via a path 632 and the second output terminal being coupled to deflection plate 616 via a path 634. Similarly, DAC/amplifier circuit 630 is coupled to monitor circuit 610 via a path 636 and to deflection plate 618 via a path 638. Although DAC/amplifier towers 604 and 606 include one DAC/amplifier circuit each, the description is for exemplary purposes only and the DAC/amplifier towers 604 and 606 would, in practice, include additional DAC/amplifier circuits respectively associated with additional deflection plates.

Analyzer circuits 612 and 614 may include components similar to the components included in analyzer circuit 252 of DAC/amplifier testing system 200 and may further be coupled to a signal generator (not shown) that provides a blanking signal to the analyzer circuits.

As described above, with reference to FIGS. 2 and 5, deflection plates 616 and 618 of e-beam mask column 602, and monitor circuits 608 and 610 receive analog voltage signals from DAC/amplifier circuits 628 and 630 due to the parallel connections represented by paths 632, 634, 636, and 638. Such an arrangement ensures that e-beam column 602 continues to generate e-beam 620 while the operation of DAC/amplifier circuits 628 and 630 is continuously tested. The remaining components of e-beam mask writer 600 operate in a manner similar to the components of DAC/amplifier testing system 200 and the testing is performed according to steps 502-520, described with reference to FIG. 5.

The foregoing description has been presented for purposes of illustration. It is not exhaustive and does not limit the invention to the precise forms or embodiments disclosed. Modifications and adaptations of the invention will be apparent to those skilled in the art from consideration of the specification and practice of the disclosed embodiments of the invention. DAC/amplifier testing system 200 may be implemented to test electronic devices other than e-beam mask writer. An error-free signal may be required in multiple electronic devices, and the signal may be tested by using the disclosed methods and systems. For example, the signal to be tested may be inverted and summed with the inverted signal and the summed signal may be analyzed based on methods and systems disclosed herein.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A digital-to-analog converter (DAC)/amplifier testing system for use in an electron-beam (e-beam) mask writer, the e-beam mask writer including a plurality of DAC/amplifier circuits to output analog voltage signals, each DAC/amplifier circuit having a first output terminal and a second output terminal, the first output terminals of the plurality of DAC/amplifier circuits being respectively coupled to deflection plates of the e-beam mask writer to provide the output analog voltages as deflection voltages, the testing system comprising:

a summation circuit, coupled to receive the output analog voltage signals on the second output terminals, to sum the received voltage signals and to output a summation signal indicating the sum of the received analog voltage signals; and an analyzer circuit comprising:

a high speed digitizer circuit to digitize the summation signal; and an error detection circuit coupled to receive the digitized summation signal and to compare the digitized summation signal with an error tolerance range to detect whether at least one of the DAC/amplifier circuits is experiencing an operating error.

2. The DAC/amplifier testing system of claim 1, further comprising a signal generator to generate a blanking signal to be used during the detection, wherein the error detection circuit performs the comparing during a detection period of the blanking signal and the operating error is detected when the digitized summation signal is outside the error tolerance range.

3. The DAC/amplifier testing system of claim 2, wherein the analyzer circuit further comprises:

a memory device for storing a record of the detected operating error, the record including a sample of data representing the digitized summation signal, a corresponding time stamp, and additional information representing data that is digitized by the high speed digitizer immediately before the detection period; and a controller coupled to control the high speed digitizer circuit.

4. The DAC/amplifier testing system of claim 1, wherein the error tolerance range is changed during operation of the e-beam mask writer.

5. The DAC/amplifier testing system of claim 1, further including a plurality of monitor circuits to receive the analog voltage signals via the second output terminals of the DAC/amplifier circuits, to generate refined analog voltage signals corresponding to the outputted analog voltage signals, wherein each of the monitor circuits includes a high input impedance buffered amplifier and the second output terminals of the DAC/amplifier circuits are respectively coupled to corresponding ones of the monitor circuits.

6. The DAC/amplifier testing system of claim 4, wherein the operating error is detected during operation of the e-beam mask writer.

7. The DAC/amplifier testing system of claim 3, wherein the sample of data is used to generate a waveform to determine a type of the operating error.

8. The DAC/amplifier testing system of claim 5, wherein a first group of voltages is applied to a first group of the deflection plates and a second group of voltages is applied to a second group of the deflection plates, the first and second group of voltages being based on the deflection voltages and astigmatic correction voltages, wherein the DAC/amplifier circuits operate within the error tolerance range if a sum of the first group of voltages or a sum of the second group of voltages is approximately zero volts.

9. The DAC/amplifier testing system of claim 1, the output analog voltage signals are a group of signals having a net sum of approximately zero volts when there is no operating error.

10. A testing apparatus, comprising:
   a summation circuit to receive a plurality of analog voltage signals, to sum the analog voltage signals, and to output a summation signal indicating the sum of the analog voltage signals;
   a signal generator to generate a blanking signal; and
   an analyzer circuit, coupled to receive the summation signal, comprising:
      a high speed digitizer to convert the summation signal into a digitized summation signal; and
      an error detection circuit, coupled to receive the digitized summation signal and the blanking signal, to check the digitized summation signal for an operating error by comparing the digitized summation signal with an error tolerance range, during a detection period of the blanking signal.

11. The testing apparatus of claim 10, wherein the operating error is detected when the digitized summation signal is outside the error tolerance range.

12. The testing apparatus of claim 11, wherein the analyzer circuit further comprises:
   a memory device coupled to store a record of the detected operating error, the record including a sample of data representing the digitized summation signal, a corresponding time stamp, and additional information representing data that is digitized by the high speed digitizer immediately before the detection period; and
   a controller coupled to control the high speed digitizer circuit.

13. The testing apparatus of claim 11, wherein the analyzer circuit generates a notification when the operating error is detected and the sample of data is used to generate a waveform to determine a type of the operating error.

14. The testing apparatus of claim 10, wherein the operating error indicates a malfunction in one of a plurality of DAC/amplifier circuits, the plurality of analog voltage signals corresponding to output voltages of the DAC/amplifier circuits.

15. The testing apparatus of claim 10, wherein the analog voltage signals are a group of signals having a net sum of approximately zero volts when there is no operating error.

16. A testing apparatus, comprising:
   a high speed digitizer to receive a summation signal and to convert the summation signal into a digitized summation signal;
   a controller coupled to control the high speed digitizer circuit;
   an error detection circuit, coupled to receive the digitized summation signal and a blanking signal, to check the digitized summation signal for an operating error by comparing the digitized summation signal with an error tolerance range, during a detection period of the blanking signal; and
   a memory device to store a record of the detected operating error and a corresponding time stamp, the operating error being detected when the digitized summation signal is outside the error tolerance range.

17. The testing apparatus of claim 16, wherein the operating error indicates a malfunction in one of a plurality of DAC/amplifier circuits, the summation signal representing a sum of a plurality of analog voltage signals corresponding to output voltages of the DAC/amplifier circuits.

18. A method of testing a plurality of DAC/amplifier circuits by a DAC/amplifier testing system, the method comprising:
   receiving a plurality of analog voltage signals respectively outputted by the plurality of DAC/amplifier circuits;
   summing the analog voltage signals;
   generating a summation signal indicating the sum of the analog voltage signals;
   converting the summation signal into a digitized summation signal;
   checking the digitized summation signal to detect an operating error; and
   storing a record of the operating error, in a memory device of the DAC/amplifier testing system, when the operating error is detected, wherein the record includes a sample of data representing the digitized summation signal.

19. The method of claim 18, further comprising generating a blanking signal and performing the checking during a detection period of the blanking signal.

20. The method of claim 19, wherein the checking is performed by comparing the digitized summation signal with an error tolerance range, the operating error being detected when the digitized summation signal is outside the error tolerance range.

21. The method of claim 18, further comprising:
   generating a notification indicating detection of the operating error,
   wherein the detected operating error represents a malfunction in one of the plurality of DAC/amplifier circuits; and
   generating a waveform using the sample of data to determine a type of the operating error.

22. A method of testing a plurality of DAC/amplifier circuits, the method being performed by an analyzer circuit, the method comprising:
   receiving a summation signal indicating a sum based on output voltages of the plurality of DAC/amplifier circuits;
   converting the summation signal into a digitized summation signal;
   receiving a blanking signal;
   checking the digitized summation signal for an operating error by comparing the digitized summation signal with an error tolerance range, during a detection period of the blanking signal; and
   storing a record of the operating error, in a memory device of the analyzer circuit, when the operating error is detected, wherein the operating error is detected when the digitized summation signal is outside the error tolerance range.

23. The method of claim 22, further comprising:
   generating a notification indicating detection of the operating error, wherein the detected operating error represents a malfunction in one of the plurality of DAC/amplifier circuits;
   analyzing the record to determine a type of the operating error; and
   changing the error tolerance range during the analysis and during operation of the DAC/amplifier circuits.

* * * * *